US 6,525,804 B1

(12) United States Patent
Tanaka

(10) Patent No.: US 6,525,804 B1
(45) Date of Patent: Feb. 25, 2003

(54) EXPOSURE DEVICE CAPABLE OF ALIGNING WHILE MOVING MASK

(75) Inventor: Yoneta Tanaka, Yokohama (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/762,300

(22) PCT Filed: Jun. 7, 2000

(86) PCT No.: PCT/JP00/03689

§ 371 (c)(1),
(2), (4) Date: Feb. 8, 2001

(87) PCT Pub. No.: WO00/75729

PCT Pub. Date: Dec. 14, 2000

(30) Foreign Application Priority Data

Jun. 8, 1999 (JP) .......................................... 11-160724

(51) Int. Cl.⁷ ........................ G03B 27/42; G03B 27/58; G03B 27/62; G01B 11/00
(52) U.S. Cl. ............................. 355/53; 355/72; 355/75; 356/399
(58) Field of Search .............................. 355/53, 55, 67, 355/77, 72–76; 356/399–401; 250/548

(56) References Cited

U.S. PATENT DOCUMENTS 4,617,469 A * 10/1986 Takahashi et al. .......... 250/548
4,655,599 A * 4/1987 Ayata et al. ................ 356/400
5,204,711 A * 4/1993 Takubo et al. ............... 355/53
6,124,922 A * 9/2000 Sentoku ....................... 355/53
6,151,120 A * 11/2000 Matsumoto et al. ........ 356/399
6,285,033 B1 * 9/2001 Matsumoto .................. 250/548

FOREIGN PATENT DOCUMENTS

| JP | 60-160599 | 4/1987 |
| JP | 8-25163 | 1/1996 |
| JP | 10-22201 | 1/1998 |

* cited by examiner

Primary Examiner—Henry Hung Nguyen
(74) Attorney, Agent, or Firm—Nixon Peabody LLP; David S. Safran

(57) ABSTRACT

An exposure device and method that transfers a pattern on a mask onto a workpiece including a movable mask stage that holds the mask with the pattern, an alignment microscope movably mounted relative to the workpiece and is adapted to detect a mask alignment mark formed on the mask and a workpiece alignment mark formed on the workpiece, and a control unit adapted to move the mask stage to align the mask alignment mark and the workpiece alignment mark to thereby align the mask and the workpiece. In one embodiment, the alignment microscope is integrated with the mask stage and moves with the mask stage. In another embodiment, the alignment microscope includes an alignment microscope drive device that allows independent movement of the alignment microscope relative to the mask stage. In both embodiments, the control unit may be adapted to move the alignment microscope in search for the workpiece alignment mark if the workpiece alignment mark is initially not detected to be within a field of the alignment microscope.

16 Claims, 8 Drawing Sheets

EXPOSURE DEVICE CAPABLE OF ALIGNING WHILE MOVING MASK

BACKGROUND OF THE INVENTION

1. Field of the Invention

The present invention is directed to an exposure device that detects an alignment mark on a workpiece by a microscope, aligns a mask and workpiece and exposes a mask pattern on a workpiece. More specifically, an exposure device is provided which is adapted to move a mask without moving a workpiece and to search for a workpiece alignment mark if a workpiece alignment mark cannot be detected.

2. Description of Related Art

An exposure device is used in which a mask and workpiece are aligned to form various types of electronic devices on a workpiece, followed by exposing a pattern formed on a mask (mask pattern) onto a workpiece which is the processed material.

Aforementioned workpiece and mask are aligned by detection of a workpiece alignment mark (hereinafter abbreviated workpiece mark) formed on a workpiece and a mask alignment mark (hereinafter abbreviated mask mark) formed on a mask via an alignment microscope, followed by matching the spatial relationships of the two (for example, overlap). The workpiece mark and the mask mark are usually created at two locations and are aligned by moving the workpiece in the horizontal direction relative to the mask.

Available types of aforementioned exposure devices include an exposure device that exposes a mask pattern on a workpiece that had been divided into individual sheets (termed a sheet type exposure device) and an exposure device (termed a band-shaped workpiece exposure device) that sequentially exposes a mask pattern on a workpiece while moving a band-shaped film workpiece (band-shaped workpiece).

A conventional sheet type exposure device and a band-shaped workpiece exposure device are explained below.

(1) Sheet Type Exposure Device

FIG. 6 shows the outline structure of a sheet type exposure device.

As shown in that diagram, workpiece stage WS is laid on frame 1 so that it can move in the XYθ directions (X would be the direction to the left/right in the diagram, Y would be the direction perpendicular to the plane of the paper, θ would be rotation about an axis perpendicular to the XY plane) via workpiece stage movement mechanism 10. Mask stage MS that holds mask M is mounted on frame 1. Furthermore, alignment microscope 2 is mounted on frame 1 via an insertion, removal mechanism (not illustrated) during detection of an alignment mark.

Mask mark MAM and workpiece mark WAM are mounted at two locations on mask M and on workpiece W, respectively, and aforementioned mask mark MAM image and workpiece mark WAM image are received, after which mask M and workpiece W are aligned.

Photo-irradiation device 3 is mounted over alignment microscope 2 and mask stage MS, and light having exposure light is irradiated from photo-irradiation device 3 during exposure resulting in exposure of the mask pattern that had been formed on the mask on to the workpiece W.

Exposure processing using an exposure device with aforementioned structure is carried out as follows.

Mask mark MAM and workpiece mark WAM are detected by alignment microscope 2 when workpiece W is laid on workpiece stage WS. Workpiece stage WS is moved in the XYθ direction by workpiece stage movement mechanism 10 so that the spatial relationships of the two coincide.

Light having exposure light is irradiated from photo-irradiation device 3 when alignment of mask M and workpiece W is completed. A mask pattern is projected, focused on workpiece W and exposure is completed.

If the conveyance precision of workpiece W is poor when detecting aforementioned workpiece mark WAM, the workpiece mark would not enter the field of alignment microscope 2 when workpiece W is laid on workpiece stage WS. In such a case, workpiece W (via workpiece stage WS) would be moved and the workpiece mark would be sought.

A method of moving a workpiece and of searching for a workpiece mark has been presented in the gazette of Japanese Kokai Publication Hei-10-22201, for example, in which nine regions of an alignment microscope are sequentially searched as a function of the field thereof in spiral fashion by moving a workpiece stage.

FIG. 7 shows an example of aforementioned spiral search procedure. Field AS of an alignment microscope is a 1.5 mm square, for example. The workpiece stage is moved in sequential spirals [1] to [8] centering on the alignment microscope in FIG. 7 in a search until the workpiece mark is detected.

In this case, the workpiece stage is moved so that the regions SS of search would overlap to permit the workpiece mark to be detected even when it is at the boundary of field AS of the alignment microscope. The width of overlapping regions SS would be suitably set in conjunction with field AS of the alignment microscope. In aforementioned case, the width would be set at 800 to 500 μm, for example. If the workpiece mark is not detected in searches [1] to [8] in FIG. 7, an error would be concluded to have occurred in the operation of workpiece mark mounting itself and processing would be halted as an abnormality of an undetectable workpiece mark.

(2) Band-shaped Workpiece Exposure Device

A band-shaped workpiece would be a long film of organic material or a continuous, long workpiece of thin metal, for example. A band-shaped workpiece would be exposed by unwinding the workpiece from its roll, exposing it, and then rewinding it into a roll.

Thick workpieces (workpiece thickness t=150 μm or more, for example, workpieces exceeding 250 μm thickness are often used) or workpieces comprising resin film lined with copper foil (so-called stiff) workpieces have come into use recently as band-shaped workpieces.

There are cases in which the mask is moved without moving the workpiece to align a mask and workpiece when using such workpieces.

Otherwise, the righting moment of the workpiece acts in the opposing direction when attempting to move a workpiece if it is thick. Since great force must be applied by the workpiece stage to counter this righting moment, the workpiece stage movement mechanism must be enlarged and the overall device must be enlarged. Furthermore, the force holding the workpiece to the workpiece stage (for example, the force retaining a workpiece by vacuum adsorption) must also withstand the righting moment. Accordingly, the workpiece could shift from the workpiece stage and alignment would then be impossible. The mask should be moved to align the mask and the workpiece in the case of this band-shaped workpiece.

FIG. 8 shows a diagrammatic structural example of a band-shaped workpiece exposure device that moves a mask to complete alignment.

Workpiece stage WS is attached onto frame 1 as shown in the diagram, and drive roller DR to convey band-shaped workpiece Wb as well as squeeze roller SR, brake roller BR and guide rollers GR1, GR2 are mounted on frame 1.

Unexposed band-shaped workpiece Wb is wound about rewind roller R1 and it is drawn out from rewind roller R1 during exposure. The workpiece Wb is conveyed onto workpiece stage WS and each prescribed region (hereinafter abbreviated exposure region) on the band-shaped workpiece is exposed. The exposed band-shaped workpiece Wb is then rewound on take-up roller R2.

Alignment microscope 2 is mounted on frame 1 via an insertion, removal mechanism (not illustrated) during detection of each alignment mark. In addition, mask M is attached to mask stage MS. A workpiece stage movement mechanism is not mounted on workpiece stage WS to move workpiece stage WS since mask M is moved instead without moving band-shaped workpiece Wb in alignment in the case of this example. Instead, mask stage MS is attached to frame 1 via mask stage movement mechanism 4 and mask stage MS is moved in XYθ directions.

Two mask marks MAM are formed on mask M and two workpiece marks WAM are formed in each exposure region of band-shaped workpiece Wb. Aforementioned mask mark MAM image and workpiece mark WAM image are received by alignment microscope 2, and mask M is moved and aligned with band-shaped workpiece Wb.

Photo-irradiation device 3 is mounted over mask stage MS and alignment microscope 2. Light having exposure light is irradiated from photo-irradiation device 3 during exposure and a mask pattern is exposed on each exposure region of the band-shaped workpiece Wb.

Exposure processing is carried out as follows in an exposure device with aforementioned structure.

A prescribed amount of band-shaped workpiece Wb that is unwound from rewind roller R1 is conveyed by rotation of drive roller DR to the right in the diagram. An exposure region of band-shaped workpiece Wb reaches a prescribed position on workpiece stage WS.

Band-shaped workpiece Wb is fixed in place by vacuum adsorption on workpiece stage WS. Alignment microscope 2 is then inserted.

A mask mark MAM image and a workpiece mark image are received by the alignment microscope 2, are then fed to an image processor which is (not illustrated), and the alignment of mask mark MAM with workpiece mark WAM is detected. The spatial data are fed to a control unit (not illustrated). The control unit moves mask stage MS in the XYθ directions so that mask mark MAM and workpiece mark WAM will overlap to complete alignment of mask M with band-shaped workpiece Wb.

When alignment is completed, alignment microscope 2 is withdrawn, light including exposure light is irradiated from photo-irradiation device 3, and exposure is carried out so that a mask pattern formed on mask M would be projected, focused on the band-shaped workpiece Wb.

When exposure processing is completed, irradiation of light having exposure light from photo-irradiation device 3 is terminated, vacuum adsorption on workpiece stage WS is released, drive roller DR is actuated and band-shaped workpiece Wb is moved until the next exposure region of band-shaped workpiece Wb reaches a prescribed position on workpiece stage WS.

Band-shaped workpiece Wb is conveyed by the rotation of drive roller DR, for example, as mentioned above. However, there are cases in which the position of band-shaped workpiece Wb deviates slightly relative to workpiece stage WS because of problems associated with the conveyance precision, the termination precision, and slight undulation during conveyance. There are also cases in which the position of workpiece mark WAM relative to workpiece W is inherently off due to problems associated with the precision of the equipment that mounted workpiece mark WAM in the preceding step.

Even if alignment microscope 2 is inserted at a set position after conveyance of band-shaped workpiece Wb has halted, workpiece mark WAM may still deviate from field AS of alignment microscope 2 in such cases. Specifically, the detection of workpiece mark WAM may be impossible.

Spiral searching in the search for workpiece mark WAM as explained in FIG. 7 would be possible if band-shaped workpiece Wb could be moved in such a case.

In the previous device of FIG. 6, the relative positions of mask mark MAM and alignment microscope 2 would not change since alignment microscope 2 and mask M are not moved if the workpiece is moved and workpiece mark WAM is sought. Accordingly, alignment would be possible if workpiece mark WAM were detected.

However, aforementioned spiral-shaped search by moving the workpiece W would not be possible in the device of FIG. 8 since band-shaped workpiece Wb could not be moved even if workpiece mark WAM should deviate from the detection range of alignment microscope 2 when aligning mask M with band-shaped workpiece Wb by moving mask M while fixing alignment microscope 2. Accordingly, the mask M could not be aligned with the workpiece W in this case.

The present invention was devised in light of aforementioned circumstances. The purpose is to provide an exposure device that moves and aligns a mask with a workpiece in which a workpiece alignment mark could be sought even if the workpiece alignment mark should deviate from the field of an alignment microscope. After its detection, the mask could be aligned with the workpiece.

SUMMARY OF THE INVENTION

In accordance with embodiment of the present invention, aforementioned problems of prior art devices are resolved in the following manner.

(1) A mask alignment mark formed on a mask and a workpiece alignment mark formed on a workpiece are detected by an alignment microscope and the mask is aligned with the workpiece in an exposure device that copies a pattern formed on a mask onto a workpiece. A mask stage move means that moves a mask stage MS holding aforementioned mask, an alignment microscope that is integrated with aforementioned mask stage MS, and a control means that moves aforementioned mask to align it with a workpiece, are mounted in such a device.

When aforementioned control means detects an alignment mark using aforementioned alignment microscope, aforementioned mask stage and alignment microscope are moved together to search for the workpiece alignment mark if the workpiece alignment mark is not within the field of the alignment microscope. Once the mask alignment mark and the workpiece alignment mark enter the field of the alignment microscope, the mask stage MS can be moved and the mask can be aligned with the workpiece.

(2) A mask alignment mark formed on a mask and a workpiece alignment mark formed on a workpiece are detected by an alignment microscope and the mask is aligned with the workpiece in an exposure device that copies a pattern formed on a mask onto a workpiece. A mask stage move means that moves a mask stage holding aforementioned mask, a means for moving aforementioned alignment microscope, and a control means that moves aforementioned mask to align it with a workpiece, are mounted in such a device.

If the workpiece alignment mark is not within the field of the alignment microscope when detecting the alignment mark using aforementioned alignment microscope, aforementioned control means moves the aforementioned alignment microscope in a search for the workpiece alignment mark. After the workpiece alignment mark has been detected, the mask is moved over the same distance as the distance which the alignment microscope was moved and the mask stage would then be moved to complete alignment of the mask and workpiece once the mask alignment mark and the workpiece alignment mark had entered the field of the alignment microscope.

The alignment microscope and mask are moved in a search for a workpiece alignment mark, as indicated above, if the workpiece alignment mark should not fall within the field of an alignment microscope. Consequently, a workpiece alignment mark can be detected and alignment can be completed even in a device with a workpiece such as aforementioned band-shaped workpiece which cannot be moved.

Furthermore, a workpiece alignment mark can be sought using a simple structure if the mask stage holding a mask and an alignment microscope are integrated so that the position relative to the alignment microscope does not change.

DETAILED DESCRIPTION OF THE PREFERRED EMBODIMENTS

Figure 1:
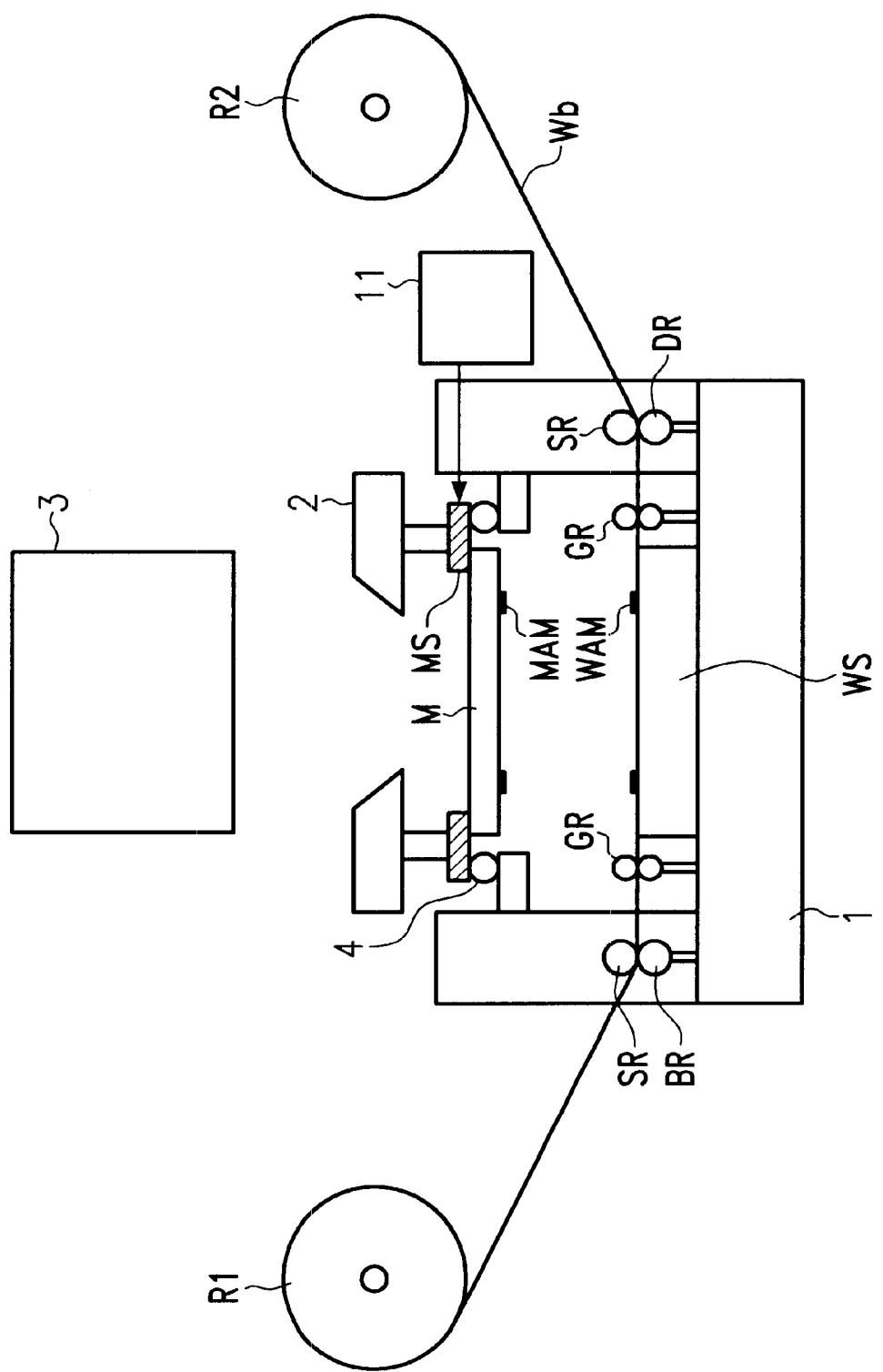
FIG. 1 is a schematic diagram showing the structure of an exposure device in one embodiment of the present invention.

FIG. 1 is a diagram showing the overall structure of an exposure device in accordance with one embodiment of the present invention. This explanation discusses a band-shaped workpiece exposure device, but the object of application of the present invention is not restricted to a band-shaped workpiece exposure device. It is also applicable to a sheet type exposure device.

In FIG. 1, workpiece stage WS is attached to frame 1 and squeeze roller SR, brake roller BR, guide rollers GR1 and GR2 are mounted on frame 1 to convey band-shaped workpiece Wb.

Unexposed band-shaped workpiece Wb is wound about rewind roller R1 and it is drawn out from rewind roller R1 and is conveyed over workpiece stage WS during exposure. Each exposure region on the band-shaped workpiece is thus exposed. The exposed band-shaped workpiece Wb is then rewound on take-up roller R2.

Mask stage MS that holds mask M is attached to frame 1 via mask stage movement mechanism 4. Mask stage MS is driven by mask stage drive mechanism 11 to move in the XYθ directions (X would be the direction to the left/right in the diagram, Y would be the direction perpendicular to the plane of the paper, θ would be rotation about an axis perpendicular to the XY plane).

Alignment microscope 2 is attached over the aforementioned mask stage MS via a microscope drive unit (not illustrated) that inserts/removes alignment microscope 2 during detection of the alignment mark.

Two mask marks MAM are formed on mask M and two workpiece marks WAM are formed in each exposure region of the band-shaped workpiece Wb as mentioned above. Aforementioned mask mark MAM image and workpiece mark WAM image are received by alignment microscope 2, and the mask M is moved and aligned with the band-shaped workpiece Wb.

Figure 2:
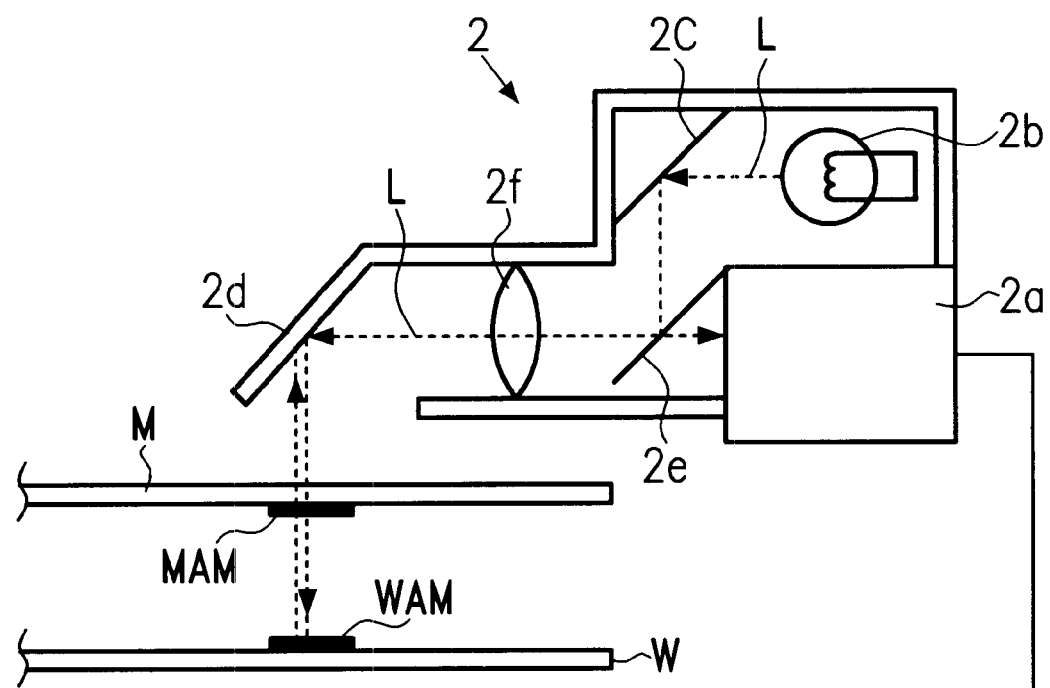
FIG. 2 is a schematic diagram showing an example of an alignment microscope.
Figure 2:
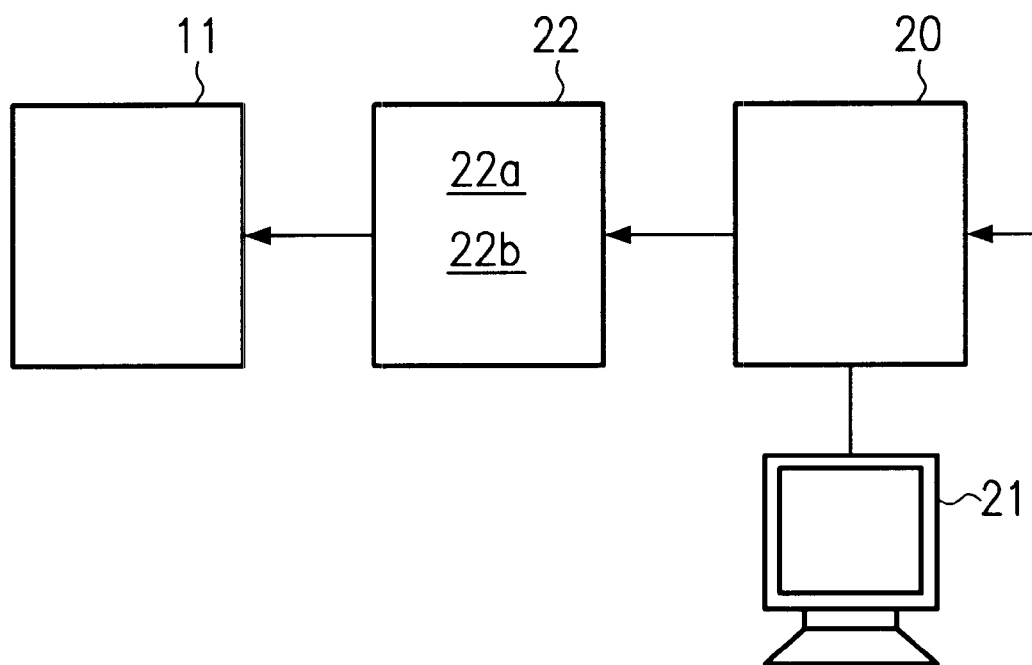

FIG. 2 is a diagram showing a constituent example of aforementioned alignment microscope 2.

Alignment microscope 2 includes reception device 2a that includes a CCD (not shown) illumination light source 2b, mirrors 2c, 2d, half-mirror 2e and lens 2f, as shown in the diagram.

Illumination light L irradiated from illumination light source 2b is irradiated via mirror 2c=>half-mirror 2e=>lens 2f=>mirror 2d onto workpiece mark WAM and on mask mark MAM inscribed on mask M to thereby illuminate them. Mask mark MAM image and workpiece mark WAM image are reflected off mirror 2d, passed through lens 2f and half-mirror 2e, and received by reception device 2a. Mask mark MAM image and workpiece mark WAM image received by reception device 2a are fed to image processing unit 20 where they are subjected to image processing and then displayed on monitor 21. In addition, their spatial data are detected and are provided to control unit 22.

Control unit 22 is provided with alignment means 22a and alignment mark search means 22b. Alignment means 22a moves mask stage MS via mask stage drive mechanism 11 in the XYθ directions so that mask mark MAM and workpiece mark WAM will overlap, and then aligns mask M with band-shaped workpiece Wb. Furthermore, alignment mark search means 22b moves mask stage MS in a spiral manner as previously described by mask stage drive mechanism 11 when workpiece mark WAM deviates from the detection range of alignment microscope 2, as further described below, and searches for workpiece mark WAM.

Various structures that move mask stage MS in the XYθ directions may be used as aforementioned mask stage drive mechanism 11. For example, the stage device presented in the gazette of Japanese Kokai Publication Hei-8-25163 may be used.

Figure 3:
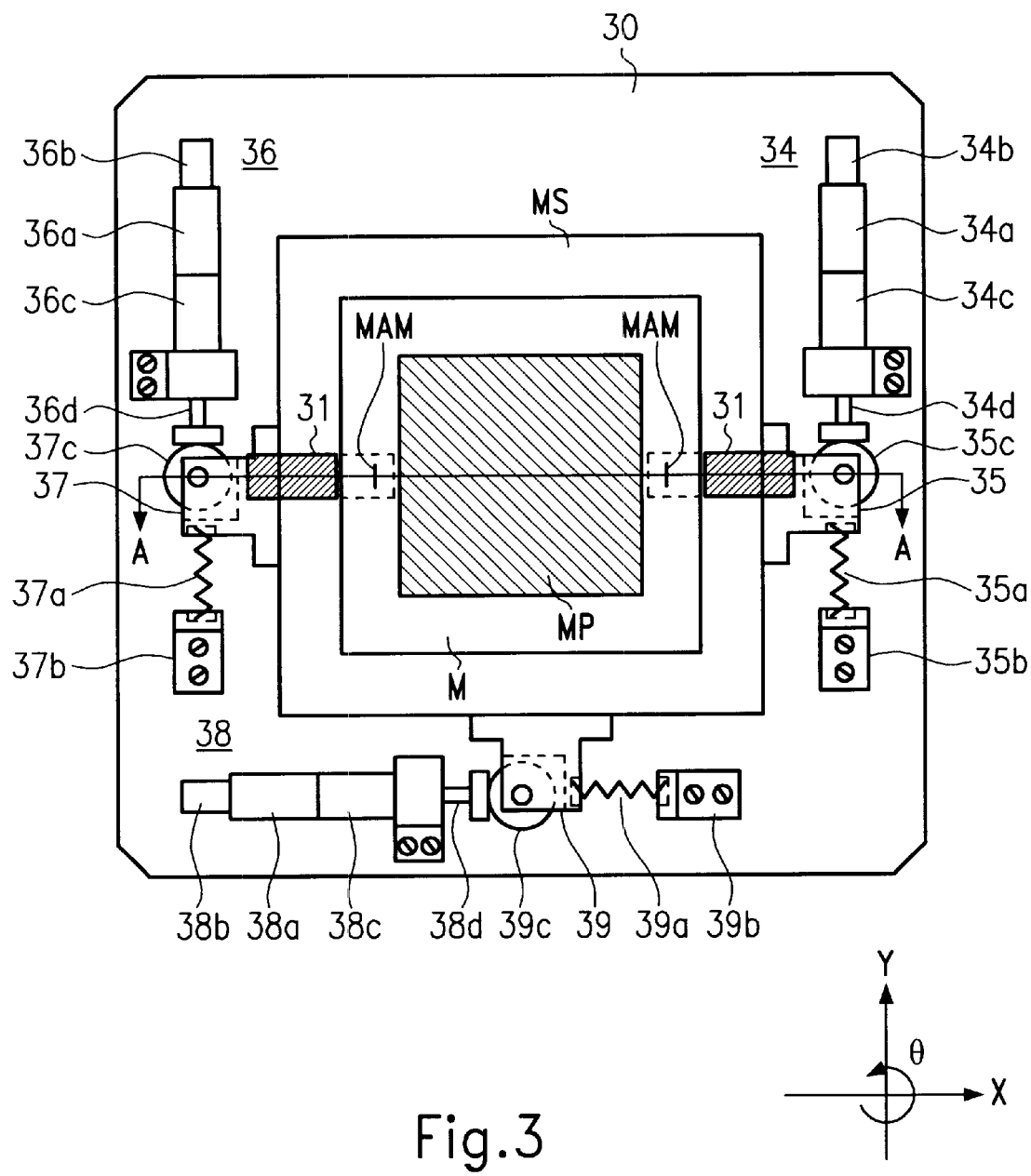
FIG. 3 is a schematic overhead diagram showing an example of the mask stage movement mechanism.
Figure 4:
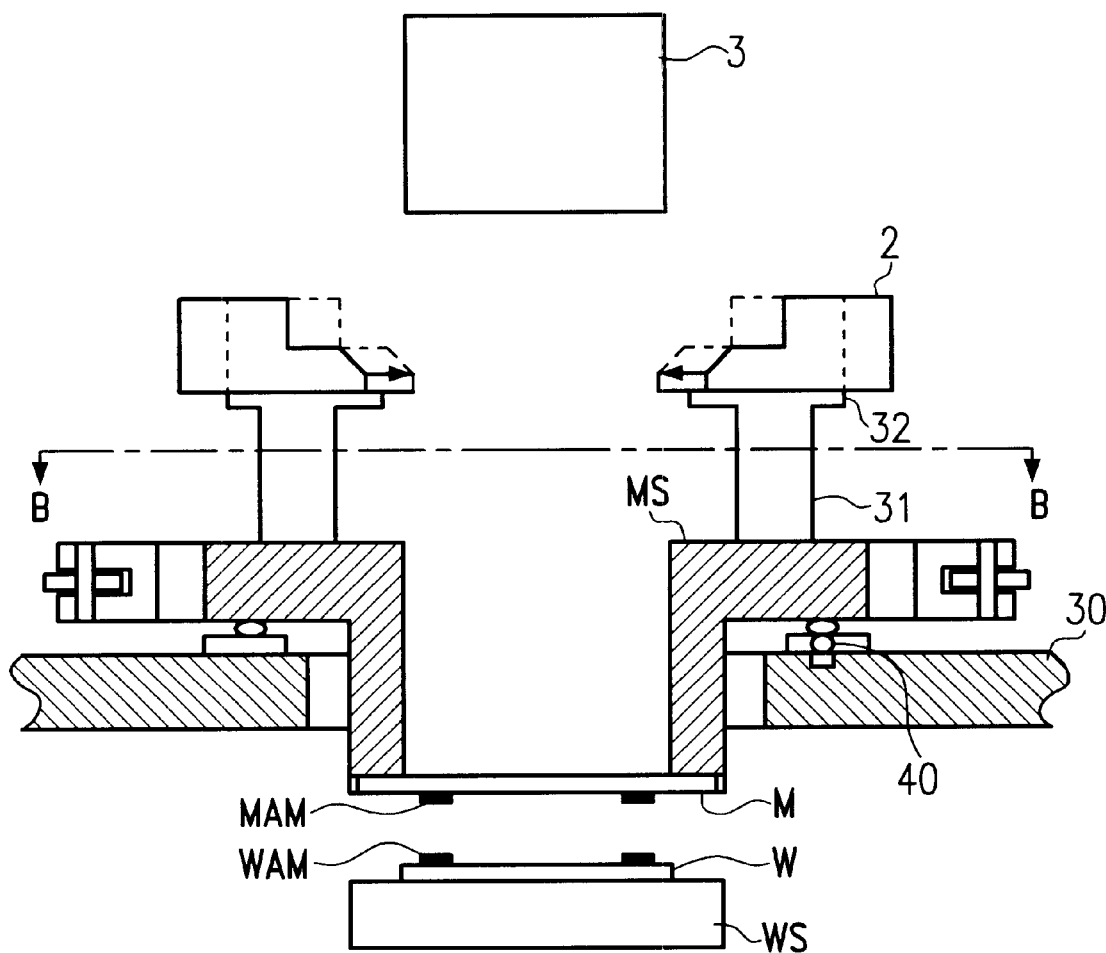
FIG. 4 is a schematic cross sectional diagram showing the mask stage movement mechanism of FIG. 3 as viewed along A—A.

FIGS. 3 and 4 are diagrams showing a constituent example of mask stage drive mechanism 11. FIG. 3 is a diagram viewing from above (diagram seen from direction B—B of FIG. 4) while FIG. 4 is a cross-sectional view through A—A of FIG. 3. The details of the drive device are omitted in FIG. 4.

FIGS. 3 and 4 show a base 30 that is mounted on aforementioned frame 1. Mask stage MS is laid on base 30 via planar guide unit 40 (see FIG. 4) and can move over base 30 in XYθ directions.

Frame 31 is erected over mask stage MS to support alignment microscope 2. Alignment microscope 2 is attached over frame 31 via microscope drive unit 32. Microscope drive unit 32 inserts alignment microscope 2 in the direction denoted by the arrows in the diagram during detection of the alignment mark and removes alignment microscope 2 after alignment is completed. Mask M provided with mask mark MAM and mask pattern MP, is secured to the mask stage MS by vacuum adsorption below the mask stage MS.

FIG. 3 shows a Y axial drive device 34 that drives mask stage MS in the Y axial direction. Y axial drive device 34 is mounted on base 30 by screws, etc. In addition, the Y axial drive device 34 includes a motor 34a, an encoder 34b, rotational/linear conversion mechanism 34c, and drive guide 34d that moves in the vertical directions of that diagram. The tip of drive guide 34d touches roller 35c that is attached to Y axial roller support unit 35 of the mask stage MS.

FIG. 3 also shows a Y' axial drive device that drives mask stage MS in the axial direction. Y' axial drive device 36 is provided with the same structures as aforementioned Y axial drive device 34, specifically, motor 36a, encoder 36b, rotational/linear conversion mechanism 36c and drive guide 36d that moves in the vertical direction of the diagram. The tip of drive guide 36d touches roller 37c that is attached to Y axial roller support unit 37 of the mask stage MS.

An X direction drive device 38 that drives mask stage MS is also shown in FIG. 3. X direction drive device 38 is similarly provided with the same structure as that of aforementioned Y axial drive device 34, specifically, motor 38a, encoder 38b, rotational/linear conversion mechanism 38 and drive guide 38d that moves in the transverse directions of the diagram. The tip of drive guide 38d is in contact with roller 39c that is attached to Y' axial roller support unit 39 of the mask stage MS.

Compression springs 35a, 37a, 39a are mounted between Y axial roller support unit 35, Y' axial roller support unit 37, X axial roller support unit 39 and spring supports 35b, 37b and 39b respectively. Compression springs 35a, 37a activate Y axial roller support unit 35 and Y' axial roller support unit 37 in the upward direction of the diagram while compression spring 39a activates X axial roller support unit 39 in the left direction of the diagram.

Y axial drive device 34 and Y' axial drive device 36 are driven by the same quantity to move mask stage MS in the Y axial direction in FIG. 3, and Y axial roller support unit 35 and Y' axial roller support unit 37 are moved in the Y direction. Furthermore, X axial drive device 38 is driven to move mask stage MS in the X axial direction and X axial roller support unit 35 is moved in the X direction.

Y axial drive device 34, Y' axial drive device 36, X axial drive device 38 are driven in directions in response to their respective directions of rotation to rotate mask stage MS.

Exposure processing using the exposure device in this embodiment is explained below.

Band-shaped workpiece Wb in FIG. 1 is drawn out from rewind roller R1, is conveyed by drive roller DR and is mounted by vacuum adsorption over workpiece stage WS.

Alignment microscope 2 is inserted at a position where it can detect mask mark MAM and workpiece mark WAM by microscope drive unit 32 shown in FIG. 4.

Illumination light L is irradiated by illumination light source 2b that is mounted in alignment microscope 2 as shown in FIG. 2. Illumination light L irradiated from illumination light source 2b is irradiated on mask mark MAM and workpiece mark WAM as noted above.

Once mask mark MAM image and workpiece mark WAM image are received by alignment microscope 2, they are subjected to image processing in image processing unit 20, are displayed on monitor 21 and their positions are detected. The spatial data that were detected are provided to control unit 22. Alignment means 22a of control unit 22 moves mask stage MS by mask stage drive mechanism 11 to thereby move mask M and complete alignment of mask M with band-shaped workpiece Wb.

Once alignment is completed and alignment microscope 2 is removed, light having exposure light is irradiated from photo-irradiation device 3. The mask pattern formed on mask M is projected/focused on band-shaped workpiece Wb and exposure is thereby carried out.

If workpiece mark WAM cannot be detected because it is not within the field of alignment microscope 2, alignment mark search means 22b of control unit 22 drives Y axial drive device 34, Y' axial drive device 36, and X axial drive device 38 shown in aforementioned FIG. 3 to move alignment microscope 2 over mask stage MS in a spiral search as noted above.

Figure 7:
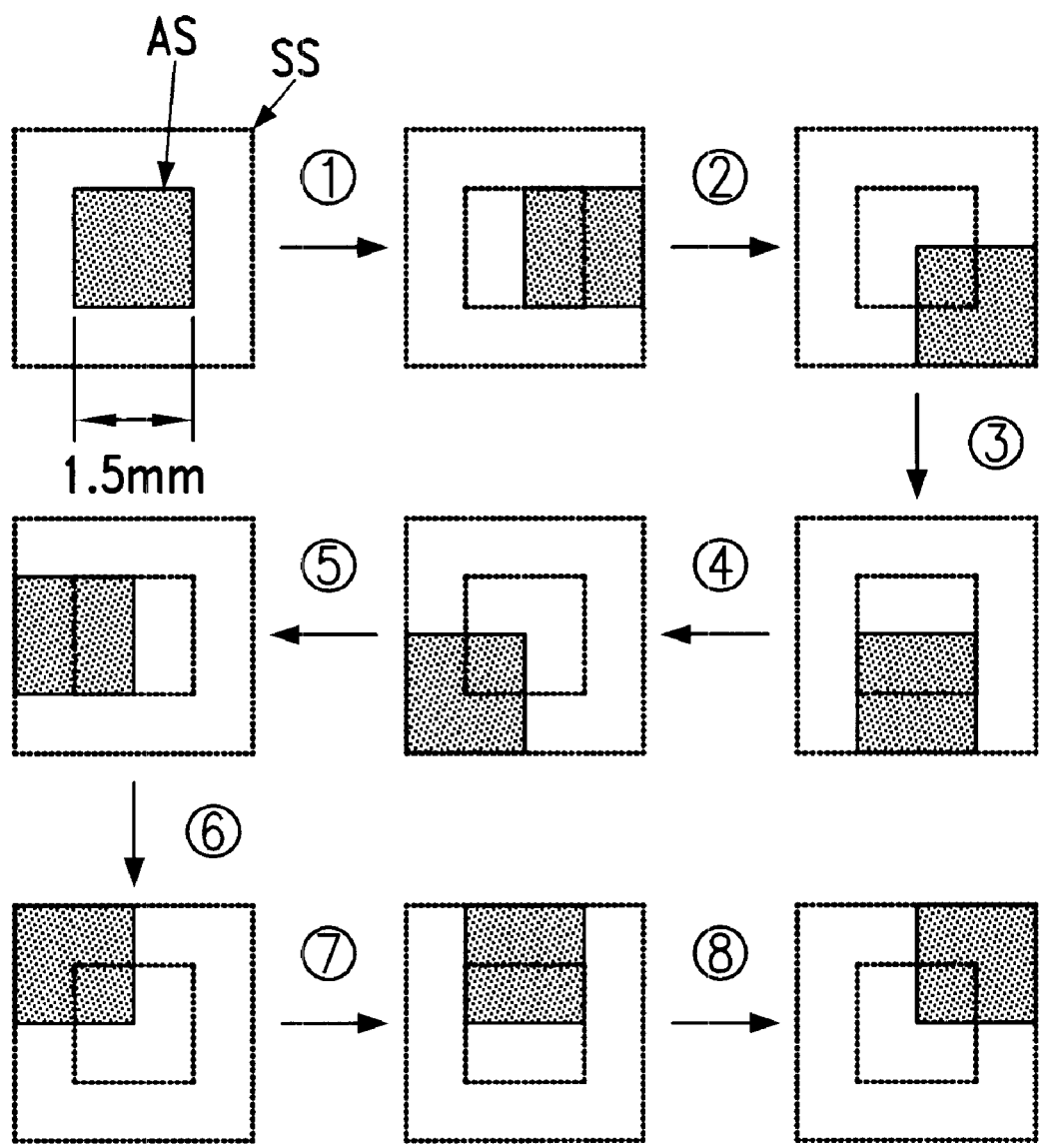
FIG. 7 is a schematic diagram explaining the prior art spiral search procedures.
Figure 8:
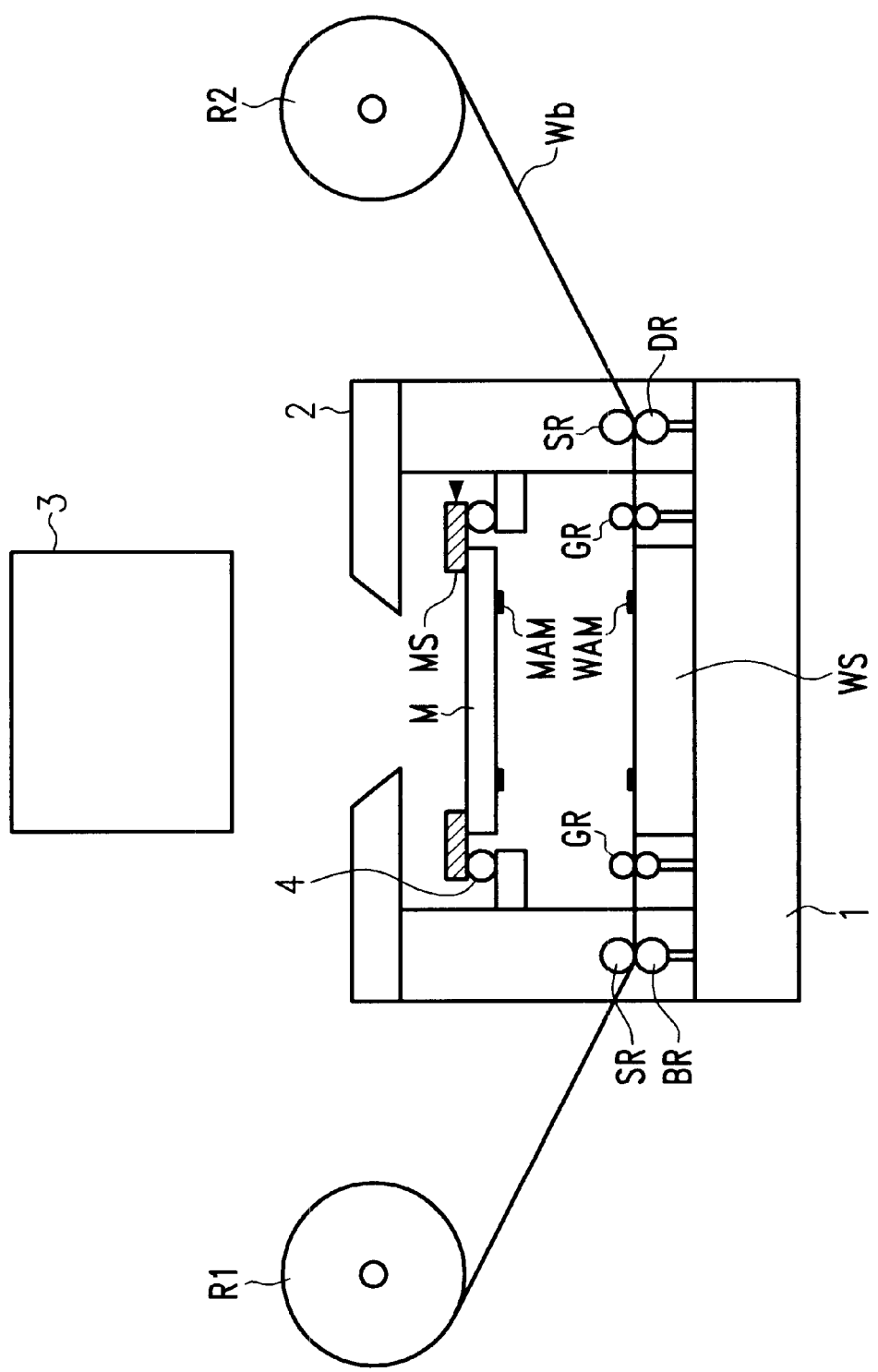
FIG. 8 is a schematic diagram showing the diagrammatic structure of a prior art band-shaped workpiece exposure device.

Specifically, aforementioned alignment mark search means 22b moves mask stage MS in a spiral shape in sequence [1] to [8] as explained in aforementioned FIG. 7 in a search until the workpiece mark has been detected. Once workpiece mark WAM has been detected, mask M and band-shaped workpiece Wb are aligned as explained above and exposure processing is carried out. If workpiece mark WAM is not detected in aforementioned searches, an error would be concluded to have occurred in the operation of workpiece mark mounting itself, and device processing would be halted as an abnormality of an undetectable workpiece mark.

Mask stage MS is moved with alignment microscope 2 since frame 31 that supports alignment microscope 2 is integrated with the mask stage MS in the exposure device of this embodiment. For that reason, workpiece mark WAM can be sought in a spiral manner as noted above without mask mark MAM deviating from the field of alignment microscope 2 during a search for workpiece mark WAM.

Alignment microscope 2 was integrated with mask stage MS in aforementioned embodiment, but alignment microscope 2 and mask stage MS may be installed separately and a movement mechanism that drives alignment microscope 2 individually may be installed.

Figure 5:
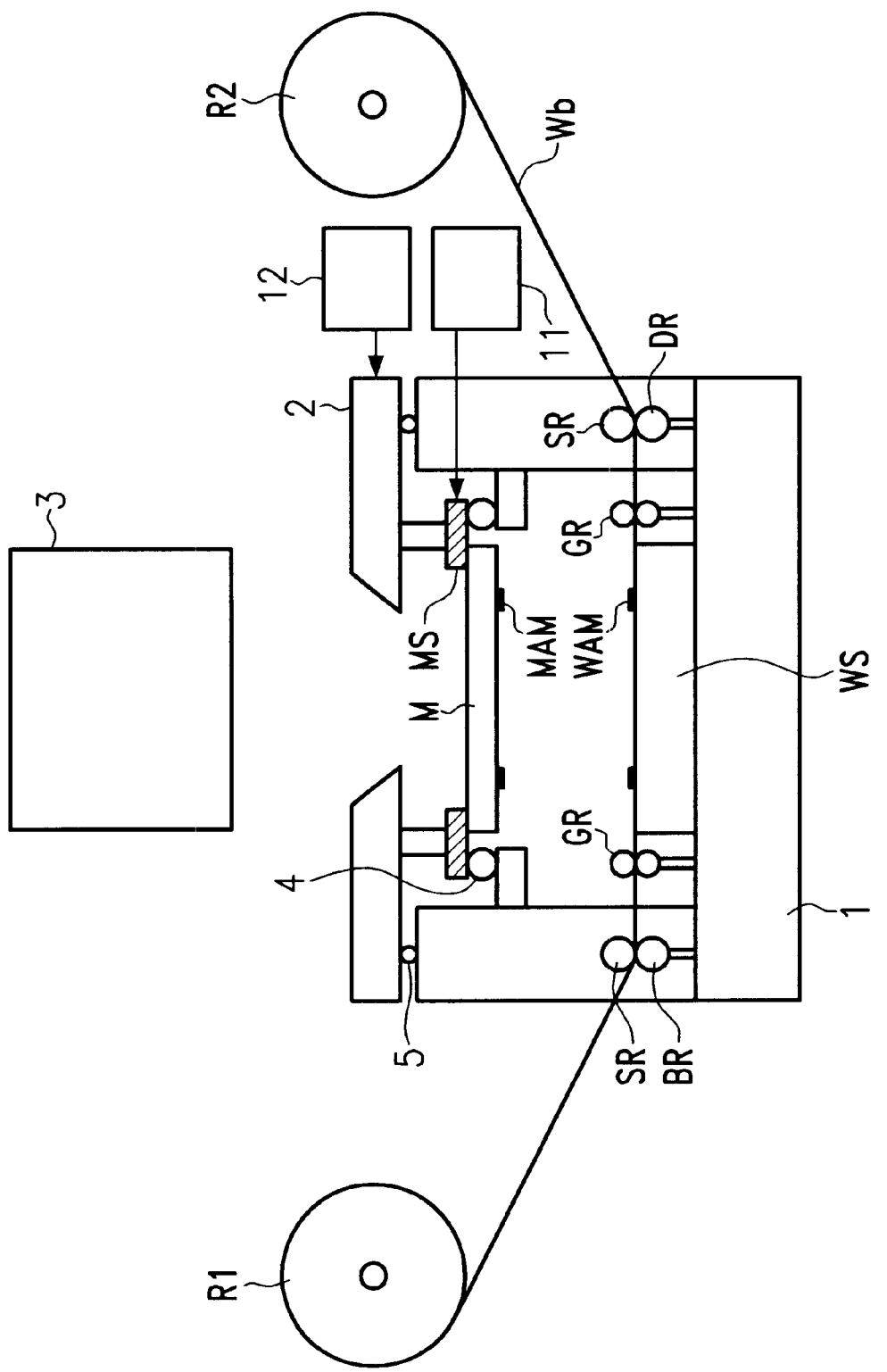
FIG. 5 is a schematic diagram showing the structure of an exposure device in another embodiment of the present invention.
Figure 6:
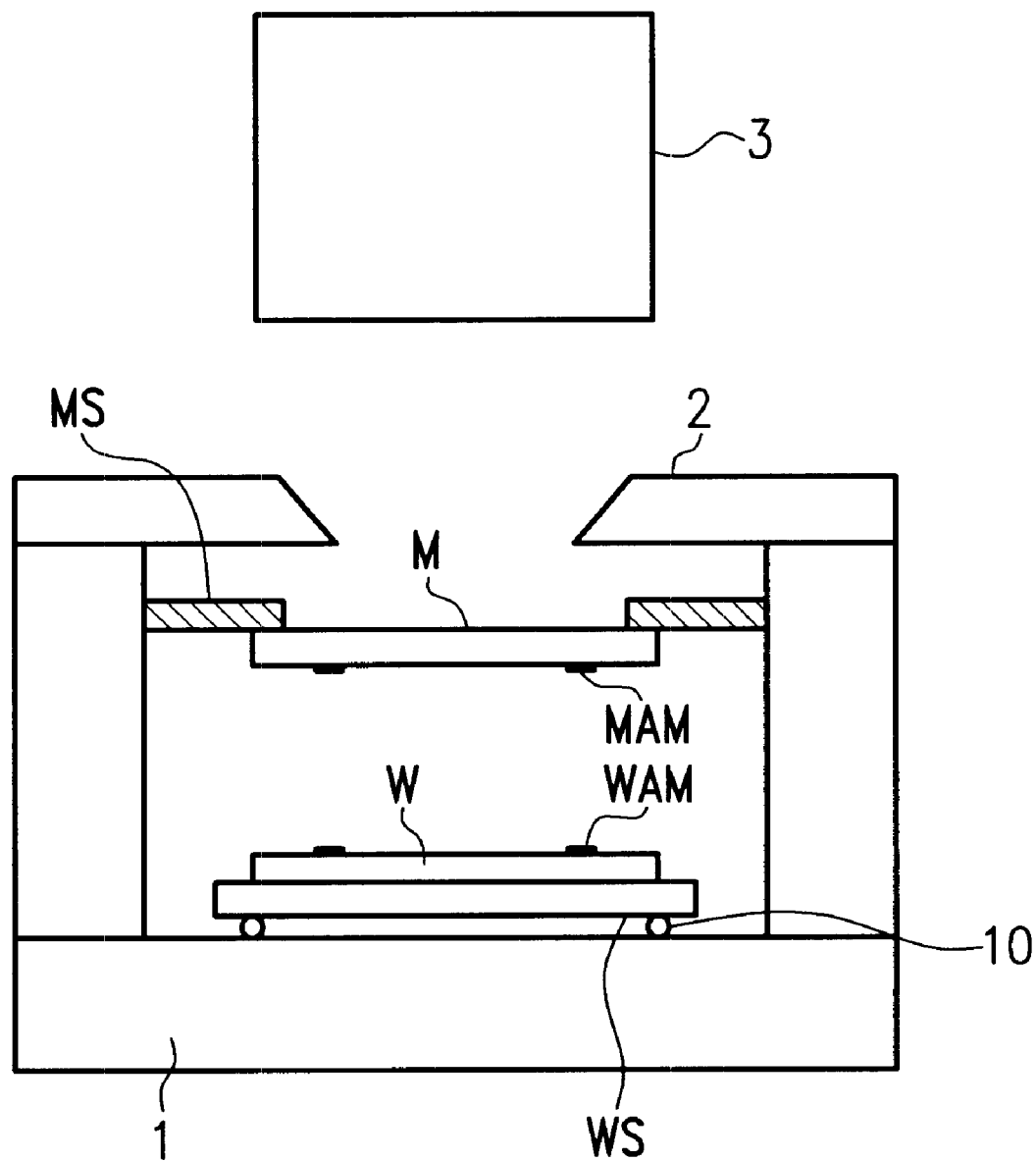
FIG. 6 is a schematic diagram showing a diagrammatic structure of prior art sheet type exposure device.

FIG. 5 is a diagram showing the structure of an exposure device in a second embodiment of the present invention in which alignment microscope 2 and mask stage MS are mounted separately.

In FIG. 5, those structures which are identical with those shown in aforementioned FIG. 1 are designated by the same reference notation. Alignment microscope movement mechanism 5 and alignment microscope drive device 12 that move alignment microscope 2 in the XY direction are mounted separately from mask stage movement mechanism 4 in this embodiment. The same alignment microscope movement mechanism 5 as that shown in aforementioned FIGS. 3 and 4 relative to the mask stage MS may be used when the spiral search need not be carried out in the θ direction).

Exposure processing using the exposure device pursuant to the present invention is carried out just as in aforementioned first embodiment. As mentioned above, band-shaped workpiece Wb is conveyed to a prescribed position over workpiece stage WS and mask M is aligned with band-shaped workpiece Wb. This is followed by irradiation of light having exposure light from photo-irradiation device 3 and projection/focusing of a mask pattern formed on mask M onto band-shaped workpiece Wb to complete exposure. Once exposure processing is completed, band-shaped workpiece Wb is moved until the next exposure region of band-shaped workpiece Wb reaches a prescribed position of workpiece stage WS, whereupon the next exposure region is exposed.

Alignment microscope drive device 12 is driven when workpiece mark WAM lies outside of the field of the microscope during the alignment of aforementioned mask and workpiece, as mentioned above. Alignment microscope 2 is then moved in a spiral manner by alignment microscope movement mechanism 5 in a search for workpiece mark WAM.

Alignment microscope 2 stops at that position once the workpiece mark has been detected in aforementioned search.

Next, mask stage MS is moved by mask stage drive mechanism 11 the same distance as the distance that alignment microscope 2 was moved. By so doing, both mask mark MAM and workpiece mark WAM are detected in the field of alignment microscope 2, after which mask M is aligned with workpiece W as mentioned above and exposure processing is carried out.

Thus, it should be evident to a person skilled in the art that the present invention discussed above has the effects and advantages noted below.

First, the present invention provides an exposure device that moves a mask stage to align a mask and workpiece where the mask stage can be moved with an alignment microscope so as to search for a workpiece mark through a spiral search, even if a workpiece mark should deviate from the field of an alignment microscope, thereby permitting a mask and workpiece to be aligned and exposure processing to be carried out.

Secondly, the position of the alignment microscope relative to the mask would not change even if the mask stage should move since in one embodiment of the present invention, the mask stage and an alignment microscope are set in an integrated structure. The workpiece alignment mark can thus be sought by moving the mask in a spiral manner with the mask mark in the detection range of the alignment microscope. For this reason, the mask can be aligned with the workpiece immediately after the workpiece mark has been detected. Furthermore, a movement mechanism need not be mounted in the alignment microscope.

In an alternative embodiment, a microscope movement mechanism that moves the alignment microscope in the XY direction is mounted in the alignment microscope which is then moved in a search for a workpiece mark. After the workpiece mark has been detected, the mask stage that holds the mask is moved the same distance as the distance that the alignment microscope was moved, thereby permitting the workpiece mark to be detected even if the workpiece mark should deviate from the field of the alignment microscope, and thus allowing the mask to be aligned with the workpiece and exposure processing to be carried out.

I claim:

1. An exposure device that exposes a pattern on a mask onto a workpiece comprising:
   a mask stage that holds the mask with the pattern, the mask stage having a mask stage movement mechanism that moves the mask stage;
   an alignment microscope movably mounted relative to the workpiece, the alignment microscope being adapted to detect a mask alignment mark formed on the mask and a workpiece alignment mark formed on the workpiece;
   a control unit adapted to move the mask stage to align the mask alignment mark and the workpiece alignment mark to thereby align the mask and the workpiece; and
   wherein the alignment microscope is integrated with the mask stage and thereby moves with the mask stage.

2. An exposure device according to claim 1, wherein the control unit is further adapted to move the mask stage with the alignment microscope in search for the workpiece alignment mark if the workpiece alignment mark is initially not detected to be within a field of the alignment microscope.

3. An exposure device according to claim 2, wherein the workpiece is band-shaped and is wound on a roll.

4. An exposure device according to claim 1, wherein the workpiece is band-shaped and is wound on a roll.

5. An exposure device that exposes a pattern on a mask onto a workpiece comprising:
   a mask stage that holds the mask with the pattern, the mask stage having a mask stage movement mechanism that moves the mask stage;
   an alignment microscope movably mounted relative to the workpiece, the alignment microscope being adapted to detect a mask alignment mark formed on the mask and a workpiece alignment mark formed on the workpiece;
   a control unit adapted to move the mask stage to align the mask alignment mark and the workpiece alignment mark to thereby align the mask and the workpiece;
   wherein the alignment microscope includes an alignment microscope drive device that allows independent movement of the alignment microscope relative to the mask stage; and
   wherein the control unit is further adapted to move the mask stage the same distance as the distance that the alignment microscope was moved in order to detect the workpiece alignment mark.

6. An exposure device according to claim 5, wherein the control unit is also adapted to move the alignment microscope in search for the workpiece alignment mark if the workpiece alignment mark is initially not detected to be within a field of the alignment microscope.

7. An exposure device according to claim 6, wherein the workpiece is band-shaped and is wound on a roll.

8. An exposure device according to claim 5, wherein the workpiece is band-shaped and is wound on a roll.

9. A method for exposing a pattern on a mask onto a workpiece comprising the steps of:
   providing a mask stage that holds the mask with the pattern;
   providing an alignment microscope movably mounted relative to the workpiece;
   detecting a mask alignment mark formed on the mask and a workpiece alignment mark formed on the workpiece using the alignment microscope;
   moving the mask stage to align the mask alignment mark and the workpiece alignment mark to thereby align the mask and the workpiece; and
   wherein the alignment microscope is integrated with the mask stage and thereby moves with the mask stage.

10. A method for exposing a pattern according to claim 9, further comprising the step of moving the mask stage together with the alignment microscope in search for the workpiece alignment mark if the workpiece alignment mark is initially not detected to be within a field of the alignment microscope.

11. A method for exposing a pattern according to claim 10, wherein the workpiece is band-shaped and is wound on a roll.

12. A method for exposing a pattern according to claim 9, wherein the workpiece is band-shaped and is wound on a roll.

13. A method for exposing a pattern on a mask onto a workpiece comprising the steps of:
- providing a mask stage that holds the mask with the pattern;
- providing an alignment microscope movably mounted relative to the workpiece;
- detecting a mask alignment mark formed on the mask and a workpiece alignment mark formed on the workpiece using the alignment microscope; and
- moving the mask stage to align the mask alignment mark and the workpiece alignment mark to thereby align the mask and the workpiece;
- wherein the alignment microscope includes an alignment microscope drive device that allows independent movement of the alignment microscope relative to the mask stage; and
- further including the step of moving the mask stage the same distance as the distance that the alignment microscope was moved in order to detect the workpiece alignment mark.

14. A method for exposing a pattern according to claim 13, further comprising the step of moving the alignment microscope in search for the workpiece alignment mark if the workpiece alignment mark is initially not detected to be within a field of the alignment microscope.

15. A method for exposing a pattern according to claim 14, wherein the workpiece is band-shaped and is wound on a roll.

16. A method for exposing a pattern according to claim 13, wherein the workpiece is band-shaped and is wound on a roll.

* * * * *